United States Patent
Matsuda et al.

(10) Patent No.: US 7,659,653 B2
(45) Date of Patent: Feb. 9, 2010

(54) ACOUSTIC WAVE DEVICE AND FILTER

(75) Inventors: Takashi Matsuda, Kawasaki (JP);
Shogo Inoue, Kawasaki (JP); Michio Miura, Kawasaki (JP); Satoru Matsuda, Kawasaki (JP); Masanori Ueda, Kawasaki (JP); Seiichi Mitobe, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 11/902,184

(22) Filed: Sep. 19, 2007

(65) Prior Publication Data
US 2008/0067891 A1 Mar. 20, 2008

(30) Foreign Application Priority Data
Sep. 19, 2006 (JP) .................... 2006-252631

(51) Int. Cl.
*H03H 9/145* (2006.01)
*H01L 41/08* (2006.01)
(52) U.S. Cl. .................. 310/313 B; 310/313 R; 333/189; 333/195
(58) Field of Classification Search ............ 310/313; 333/189–195
See application file for complete search history.

(56) References Cited

U.S. PATENT DOCUMENTS

| 5,977,686 | A  * | 11/1999 | Kadota et al. ............ 310/313 B |
| 6,557,225 | B2 * | 5/2003  | Takata et al. ............... 29/25.35 |
| 7,245,193 | B2 * | 7/2007  | Funasaka .................... 333/193 |
| 7,322,093 | B2 * | 1/2008  | Kadota et al. ................. 29/594 |
| 2002/0079987 | A1 * | 6/2002 | Yip et al. ..................... 333/193 |
| 2005/0127794 | A1 * | 6/2005 | Ozaki et al. ................. 310/346 |
| 2006/0273687 | A1 * | 12/2006 | Fujimoto et al. ........ 310/313 R |
| 2007/0222337 | A1 * | 9/2007 | Kadota et al. ............... 310/320 |
| 2008/0061657 | A1 * | 3/2008 | Matsuda et al. ............. 310/334 |
| 2008/0067896 | A1 * | 3/2008 | Inoue et al. ................. 310/335 |
| 2008/0074212 | A1 * | 3/2008 | Matsuda et al. ............. 333/195 |
| 2008/0129418 | A1 * | 6/2008 | Miura et al. ................ 333/195 |

FOREIGN PATENT DOCUMENTS

| JP | 52-16146     | 2/1977  |
| JP | 6-303073     | 10/1994 |
| JP | 11-31942     | 2/1999  |
| KR | 2004-87859   | 10/2004 |
| WO | WO 03-075458 A1 | 9/2003 |

* cited by examiner

*Primary Examiner*—Jaydi SanMartin
(74) *Attorney, Agent, or Firm*—Arent Fox LLP

(57) ABSTRACT

An acoustic wave device includes a piezoelectric substrate, a first dielectric film formed on the piezoelectric substrate, and electrodes that are provided on the first dielectric film and excite an acoustic wave, the electrodes including electrode fingers. At least a part of the first dielectric film is cut out between adjacent electrode fingers among the electrode fingers.

8 Claims, 16 Drawing Sheets

ACOUSTIC WAVE DEVICE AND FILTER

BACKGROUND OF THE INVENTION

1. Field of the Invention

The present invention relates to acoustic wave devices and filters, and more particularly, to an acoustic wave filter having a high controllability of the electromechanical coupling constant and a filter using the same.

2. Description of the Related Art

An exemplary acoustic wave device that utilizes an acoustic wave is a surface acoustic wave (SAW) device equipped with a piezoelectric substrate on which there are formed comb electrodes that form an interdigital transducer (IDT) and reflection electrodes. When electric power is applied across the comb electrodes, a surface acoustic wave is excited. Hereinafter, such a SAW device is referred to as a first prior art. The SAW device advantageously has a compact size, light weight and a high attenuation, and is widely applied to a variety of mobile equipment such as transmission/reception filters and an antenna duplexer of a cellular phone.

FIG. 1A is a plan view of a SAW device of the first prior art, and FIG. 1B is a cross-sectional view taken along a line A-A shown in FIG. 1A. The SAW device has a piezoelectric substrate made of, for example, lithium tantalate ($LiTaO_3$) on which comb electrodes 14 and reflection electrodes 16, which electrodes may be formed of aluminum, are provided. For the sake of simplicity, only a small number of fingers of the comb electrodes 14 and the reflection electrodes are illustrated in FIG. 1A. However, in practice, a large number of fingers is used to form the electrodes 14 and 16.

A variation of the first prior art has been developed (hereinafter such a variation is referred to as second prior art). As shown in FIG. 2, a protection form 18 made of silicon oxide ($SiO_2$) covers the comb electrodes 14 and the reflection electrodes 16. The protection film 18 has a thickness as thin as only a few percent of the period λ of the comb electrodes 14.

Another variation of the first prior art has been developed. This variation also has the protection film 18. However, the present variation differs from the second prior art in that the protection film 18 is thicker than the comb electrodes 14. Examples of this type of acoustic wave devices are a Love wave device (hereinafter referred to as a third prior art) and a boundary wave (fourth prior art). An acoustic wave called Love wave is propagated in the Love wave device. An acoustic wave called boundary wave is propagated in the boundary wave device. In the Love wave device and the boundary wave devices, the protection film 18 may be made of a substance having a temperature coefficient of a sign opposite to that of the temperature coefficient of the substrate of the piezoelectric substrate 12. It is thus possible to compensate for the temperature characteristic of frequency (frequently abbreviated as TCF). Particularly, the boundary wave device has an advantage that foreign particle at the interface between the two media does not cause frequency variation and does not increase the electrical loss.

FIG. 3 is a cross-sectional view of a Love wave device of the third prior art. Referring to this figure, there are provided the comb electrodes 14 and the reflection electrodes 16 on the piezoelectric substrate 12. A silicon oxide film 20 is provided so as to cover the comb electrodes 14 and the reflection electrodes 16.

FIG. 4 is a cross-sectional view of a boundary wave device of the fourth prior art. Referring to this figure, the boundary wave device differs from the Love wave device in which an aluminum oxide ($Al_2O_3$) film 22 is provided on the silicon oxide film 20 of the Love wave device of the third prior art. The boundary wave device has an essential feature such that energy of the acoustic wave is confined in the surface of the piezoelectric substrate 12 and the silicon oxide film 20.

In the acoustic wave devices described above, the interval between the resonance frequency and the anti-resonance frequency depends on the electromechanical coupling coefficient. Thus, the width of the pass band of a ladder filter and a double-mode filter using the above acoustic wave devices depends on the electromechanical coupling coefficient. It is thus necessary to make the piezoelectric substrate of a piezoelectric material having an electromechanical coupling coefficient that matches a desired pass band. However, various types of piezoelectric material are not available in practice. In view of the above circumstance, there have been proposed various methods for controlling the electromechanical coupling coefficient. The electromechanical coupling coefficient is the conversion efficiency from electrical energy to piezoelectric or acoustic energy. As the electromechanical coupling coefficient is greater, the acoustic wave by the electric signal is excited more easily.

Japanese Patent Application Publication No. 52-16146 (hereinafter Document 1) discloses the use of a titanium oxide ($TiO_2$) film between the comb electrodes and the piezoelectric substrate. Thickening the titanium oxide film can reduce the electromechanical coupling coefficient. Japanese Patent Application Publication No. 6-303073 (Document 2) discloses a method for controlling the piezoelectricity by implanting ions such as argon (Ar) on the surface of the piezoelectric substrate. This ion implantation reduces the electromechanical coupling coefficient. Japanese Patent Application Publication No. 11-31942 (document 3) discloses a technique to use a piezoelectric thin film that is provided between the comb electrodes and the piezoelectric substrate and has a greater electromechanical coupling coefficient than that of the piezoelectric substrate.

The method for controlling the electromechanical coupling coefficient disclosed in Document 1 uses a specific thickness of the titanium oxide film that ranges from 0.00016λ to 0.047λ. However, the above specific thickness is too thin to form filters for cellular phones in practice. For example, the acoustic wave device used for the cellular phones generally employs a piezoelectric substrate made of 36° Y-cut X-propagation lithium tantalate. When this piezoelectric substrate is used to form a filter in the 1.9 GHz band, the comb electrodes have a period λ of 2 μm. For this period, 0.00016λ is equal to 0.32 nm, which is too thin to practically form the electrodes in terms of the fabrication process. In addition, the electromechanical coupling coefficient is changed greatly as the thickness of the titanium oxide film is changed. It is thus difficult to control the electromechanical coupling coefficient well.

The method for controlling the electromechanical coupling coefficient described in Document 2 requires a large scale of facility such as ion implantation. In addition, there is a difficulty in control of the depth of ion implantation. For these reasons, the controllability of the electromechanical coupling coefficient is not good.

The control method described in Document 3 has a difficulty in controlling of the thickness of the piezoelectric thin film.

In short, all of the methods described in Documents 1 through 3 have difficulty in controlling the electromechanical coupling coefficient.

SUMMARY OF THE INVENTION

The present invention has been made in view of the above circumstances and provides an acoustic wave device having improved controllability of the electromechanical coupling coefficient.

According to an aspect of the present invention, there is provided and acoustic wave device including: a piezoelectric substrate; a first dielectric film formed on the piezoelectric substrate; and electrodes that are provided on the first dielectric film and excite an acoustic wave, the electrodes including electrode fingers, wherein at least a part of the first dielectric film is cut out between adjacent electrode fingers among the electrode fingers.

According to another aspect of the present invention, there is provided a filter including resonators that include an acoustic wave device configured as described above.

BRIEF DESCRIPTION OF THE DRAWINGS

Preferred embodiments of the present invention will be described in detail with reference to the accompanying figures, wherein.

DESCRIPTION OF THE PREFERRED EMBODIMENTS

A description will now be given of preferred embodiments of the present invention in conjunction with the accompanying drawings, in which only a small number of electrode fingers of comb electrodes and reflection electrodes is illustrated for the sake of simplicity. However, in practice, the comb electrodes and reflection electrodes have a large number of fingers.

First Embodiment

Figure 1A:
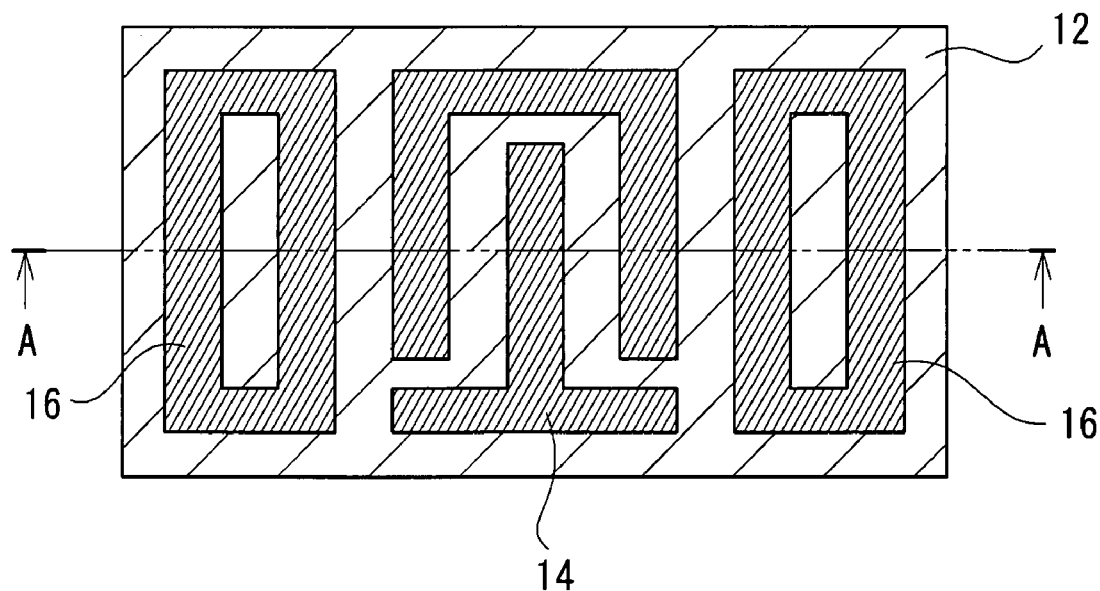
FIG. 1A is a plan view of an acoustic wave device in accordance with a first prior art.
Figure 1B:
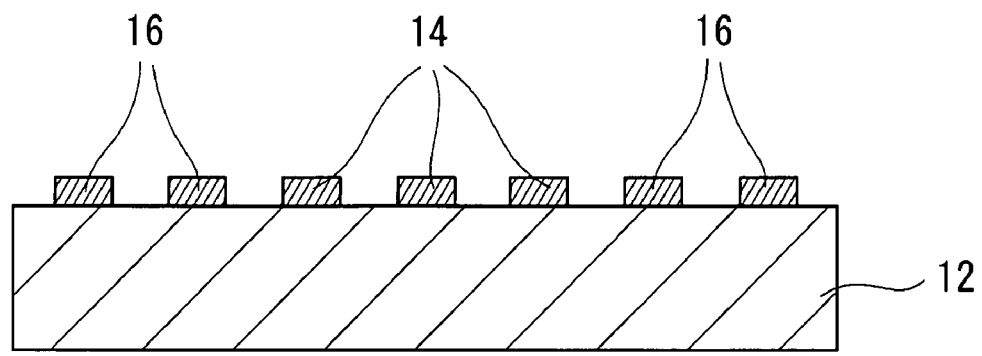
FIG. 1B is a cross-sectional view taken along a line A-A shown in FIG. 1A.
Figure 2:
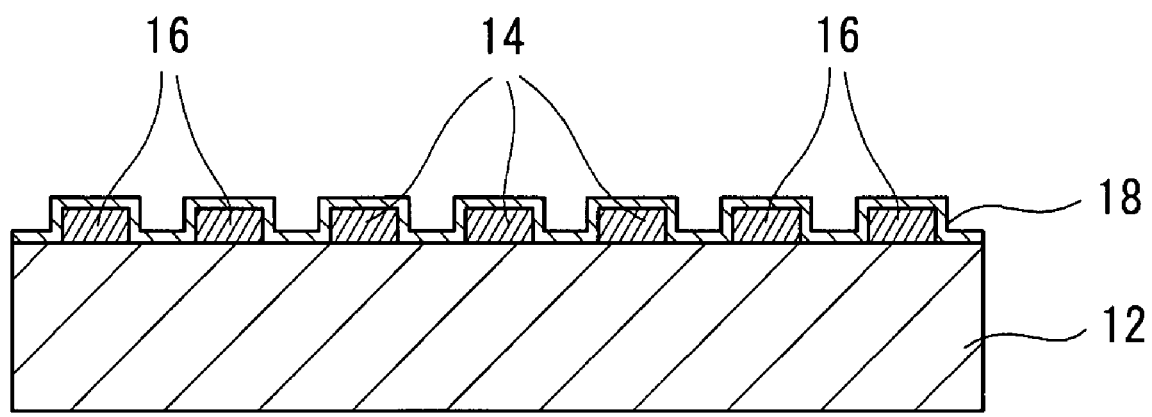
FIG. 2 is a cross-sectional view of an acoustic wave device in accordance with a second prior art.
Figure 3:
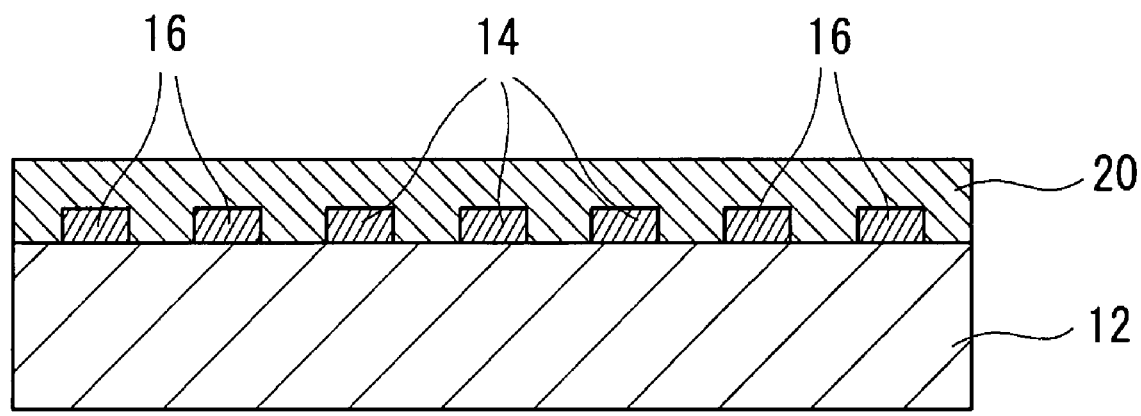
FIG. 3 is a cross-sectional view of an acoustic wave device in accordance with a third prior art.
Figure 4:
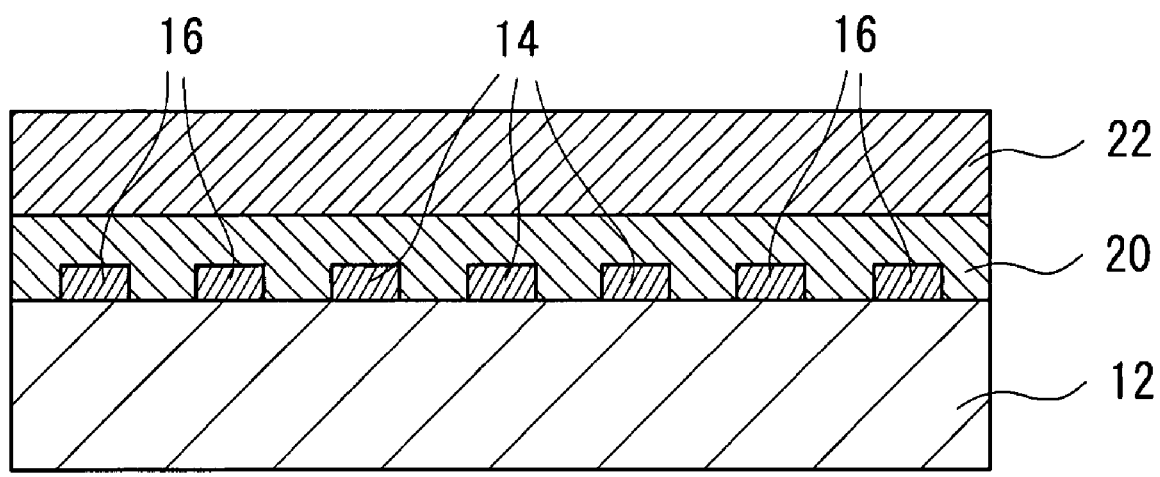
FIG. 4 is a cross-sectional view of an acoustic wave device in accordance with a fourth prior art.
Figure 5:
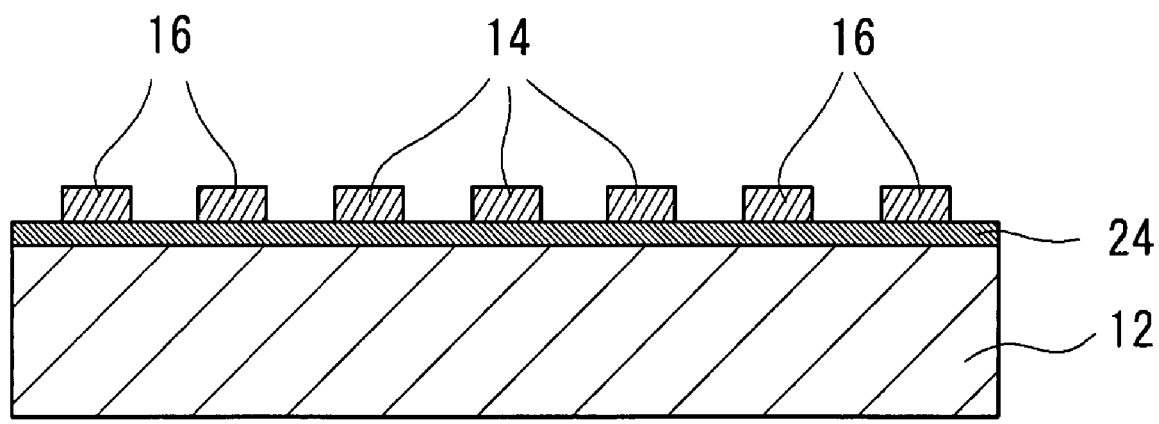
FIG. 5 is a cross-sectional view of an acoustic wave device in accordance with a first comparative example.
Figure 6:
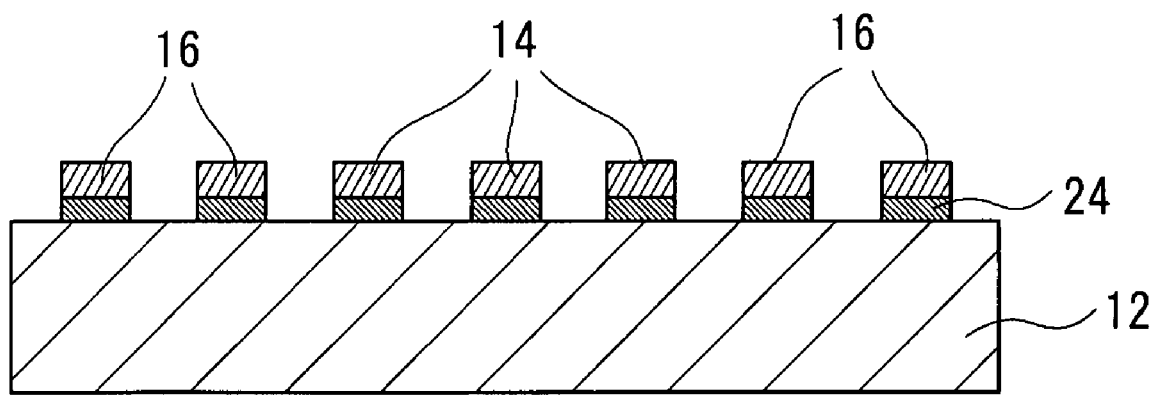
FIG. 6 is a cross-sectional view of an acoustic wave device in accordance with a first embodiment.

FIG. 5 is a cross-sectional view of an acoustic wave device in accordance with a first comparative example, and FIG. 6 is a cross-sectional view of an acoustic wave device in accordance with a first embodiment of the present invention. Referring to FIG. 5, a first dielectric film 24 made of aluminum oxide is provided on the piezoelectric substrate 12 made of, for example, 30° Y-cut X-propagation lithium niobate ($LiNbO_3$). The comb electrodes 14 and the reflection electrodes 16 are formed on the first dielectric film 24. These electrodes 14 and 16 may be made of copper (Cu) and may be 190 nm thick.

Referring to FIG. 6, the acoustic wave device of the first embodiment differs from the first comparative example in that the first dielectric film 24 is removed or cut out between the adjacent electrode fingers of the comb electrodes 14 and the reflection electrodes 16, so that side surfaces of the first dielectric film 24 are flush with those of the fingers of the comb electrodes 14 and the reflection electrodes 16. The surface of the piezoelectric substrate 12 is exposed between the adjacent fingers of the comb electrodes 14 and the reflection electrodes 16. At least a part of the first dielectric film 24 is cut out between the adjacent electrode fingers among the electrode fingers of the electrodes 14 and 16.

Figure 7:
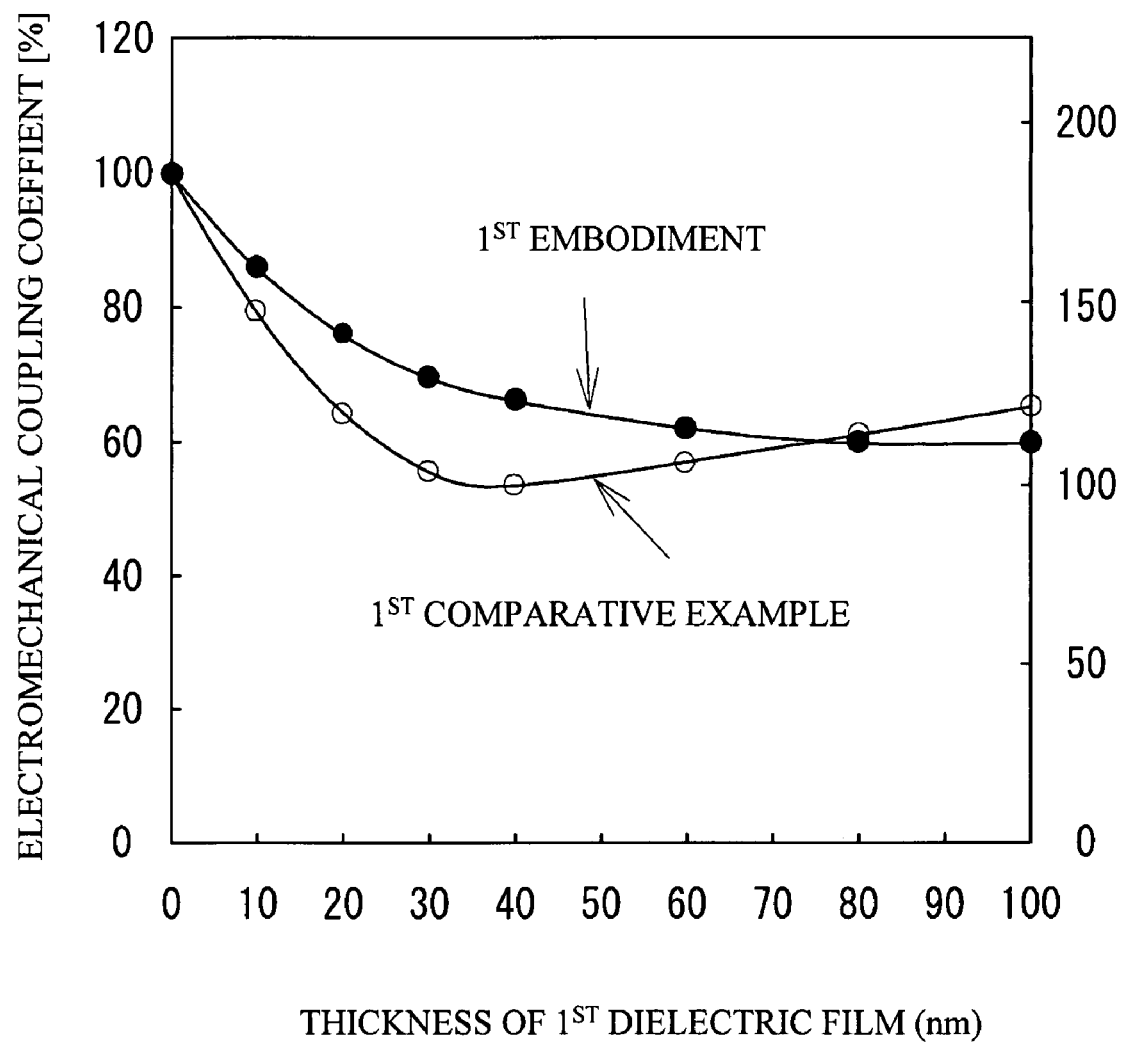
FIG. 7 shows a relationship between a film thickness and an electromechanical coupling coefficient in the first comparative example and the first embodiment.

FIG. 7 is a graph of the electromechanical coupling coefficients of the first embodiment and the first comparative example as a function of the thickness of the first dielectric film 24. In FIG. 7, the electromechanical coupling coefficients are obtained from fa-fr by using the finite element method in which the electromechanical coupling coefficient for a film thickness of 0 nm of the first dielectric film 24 is 100%, where fa denotes the anti-resonance frequency and fr denotes the resonance frequency. That is, the electromechanical coupling coefficient shown in FIG. 7 is normalized. The comb electrodes 14 have 200 pairs of electrode fingers, an aperture length of 19.3λ, and a period λ of 2.084 μm. One pair of electrode fingers consists of a single finger on the input side (one of the pair of comb electrodes) and a single finger on the output side (the other com electrode). The electrode fingers on the input side and those of the output side are interleaved and are laterally overlapped with each other over the aperture length.

FIG. 7 shows that the first embodiment has a smaller change of the electromechanical coupling coefficient with respect to change of the thickness of the first dielectric film 24 than the comparative example. Smaller change of the electromechanical coupling coefficient with respect to change of the thickness of the first dielectric film 24 enables smaller change thereof with respect to deviations of the film thickness caused during the fabrication process. Thus, the first embodiment has better controllability of the electromechanical coupling coefficient than the first comparative example. The better controllability of the first embodiment primarily results from the above-mentioned structure of the first dielectric film 24.

FIG. 7 shows that, when the first dielectric film 24 has a thickness approximately equal to or less than 50 nm (approximately 0.024λ), the first embodiment needs a greater thickness than the first comparative example for the same electromechanical coupling coefficient. Generally, the greater the film thickness, the better the process controllability of the film thickness. Thus, the first embodiment has better controllability of the film thickness than the first comparative example.

The first dielectric film 24 is not limited to the aluminum oxide film but may be made of, for example, silicon nitride, titanium oxide or silicon oxide.

The first embodiment includes a variation in which the comb electrodes 14 and the reflection electrodes 16 are covered with a protection film made of, for example, silicon oxide. This variation has better controllability of the electromechanical coupling coefficient and the film thickness.

Second Embodiment

Figure 8:
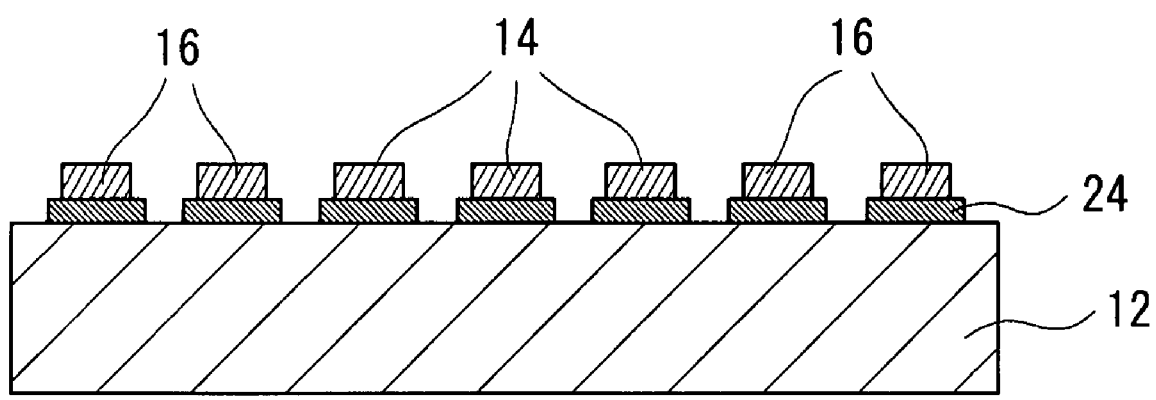
FIG. 8 is a cross-sectional view of an acoustic wave device in accordance with a second embodiment.

FIG. 8 is a cross-sectional view of an acoustic wave device in accordance with a second embodiment. The first dielectric film 24 made of, for example, aluminum oxide, is provided on the piezoelectric substrate 12 made of, for example, lithium niobate. The comb electrodes 14 and the reflection electrodes 16 made of, for example, copper, are provided on the first dielectric film 24. The first dielectric film 24 is removed between the adjacent fingers of the comb electrodes 14 and the reflection electrodes 16, so that the surface of the piezoelectric substrate 12 is exposed therebetween. The side surfaces of the electrodes 14 and 16 are not flush with those of the first dielectric film 24 but are different in width. In FIG. 8, the first dielectric film 24 is wider than the electrode fingers of the electrodes 14 and 16.

The second embodiment has a smaller change of the electromechanical coupling coefficient with respect to change of the thickness of the first dielectric film 24 than the first comparative example. Therefore, the second embodiment is capable of more precisely controlling the electromechanical coupling coefficient than the first comparative example.

The second embodiment has better controllability of the electromechanical coupling coefficient than the first comparative example, as in the case of the first embodiment. Further, the first embodiment may be advantageous to the second embodiment in terms of the simplicity in fabrication process. This is because the first embodiment is capable of defining not only the electrodes 14 and 16 but also the first dielectric film 24 by once etching. In other words, patterning the comb electrodes 14 and the reflection electrodes 16 defines the shape of the first dielectric film 24.

The second embodiment includes a variation in which the comb electrodes 14 and the reflection electrodes 16 are covered with a protection film made of, for example, silicon oxide.

Third Embodiment

Figure 9:
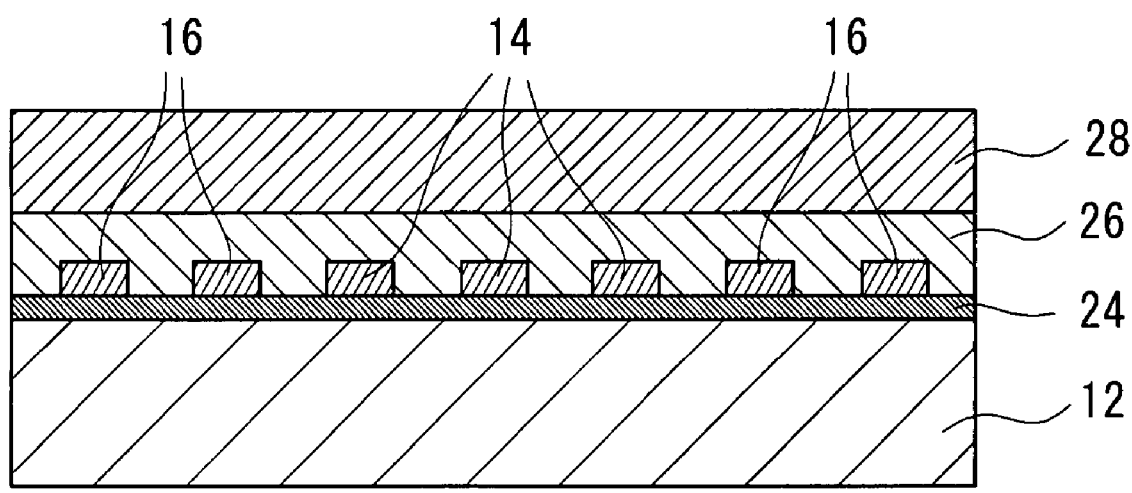
FIG. 9 is a cross-sectional view of an acoustic wave device in accordance with a third comparative example.
Figure 10:
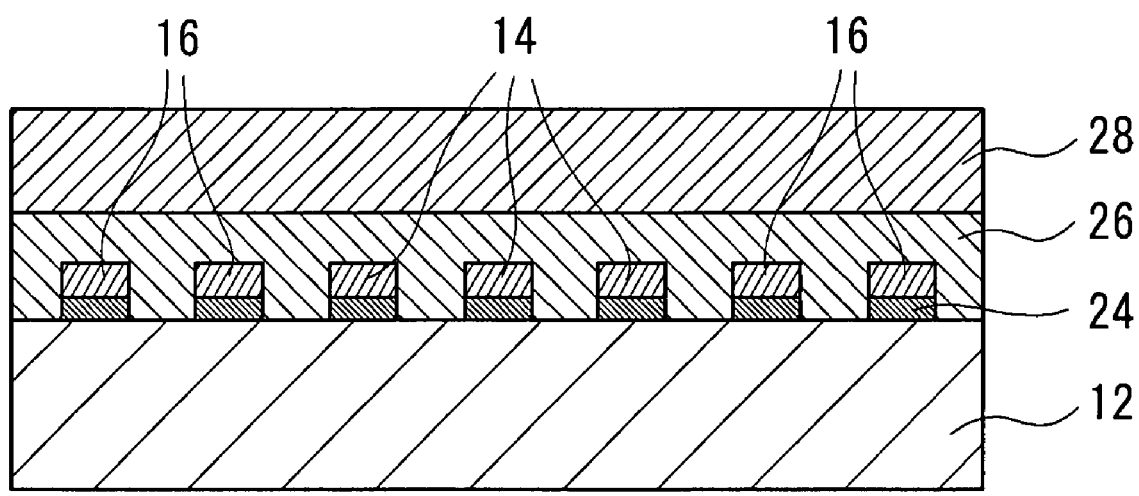
FIG. 10 is a cross-sectional view of an acoustic wave device in accordance with a third embodiment.

FIG. 9 is a cross-sectional view of an acoustic wave device in accordance with a third comparative example, and FIG. 10 is a cross-sectional view of an acoustic wave device in accordance with a third embodiment of the present invention. Referring to FIG. 9, the third comparative example has the piezoelectric substrate 12 made of, for example, 30° Y-cut X-propagation lithium niobate on which the first dielectric film 24 is formed. The comb electrodes 14 and the reflection electrodes 16, which may be 190 nm thick, are formed on the first dielectric film 24. A second dielectric film 26, which may be 1050 nm thick and made of silicon oxide, is provided so as to cover the comb electrodes 14 and the reflection electrodes 16. A third dielectric film 28, which may be 2 μm thick, is provided on the second dielectric film 26.

The third embodiment shown in FIG. 10 differs from the third comparative example shown in FIG. 9 in that the first dielectric film 24 is removed between the adjacent fingers of the comb electrodes 14 and the reflection electrodes 16 so that the second dielectric film 26 contacts the piezoelectric substrate 12 and the side surfaces of the fingers are flush with those of the first dielectric film 24.

Figure 11:
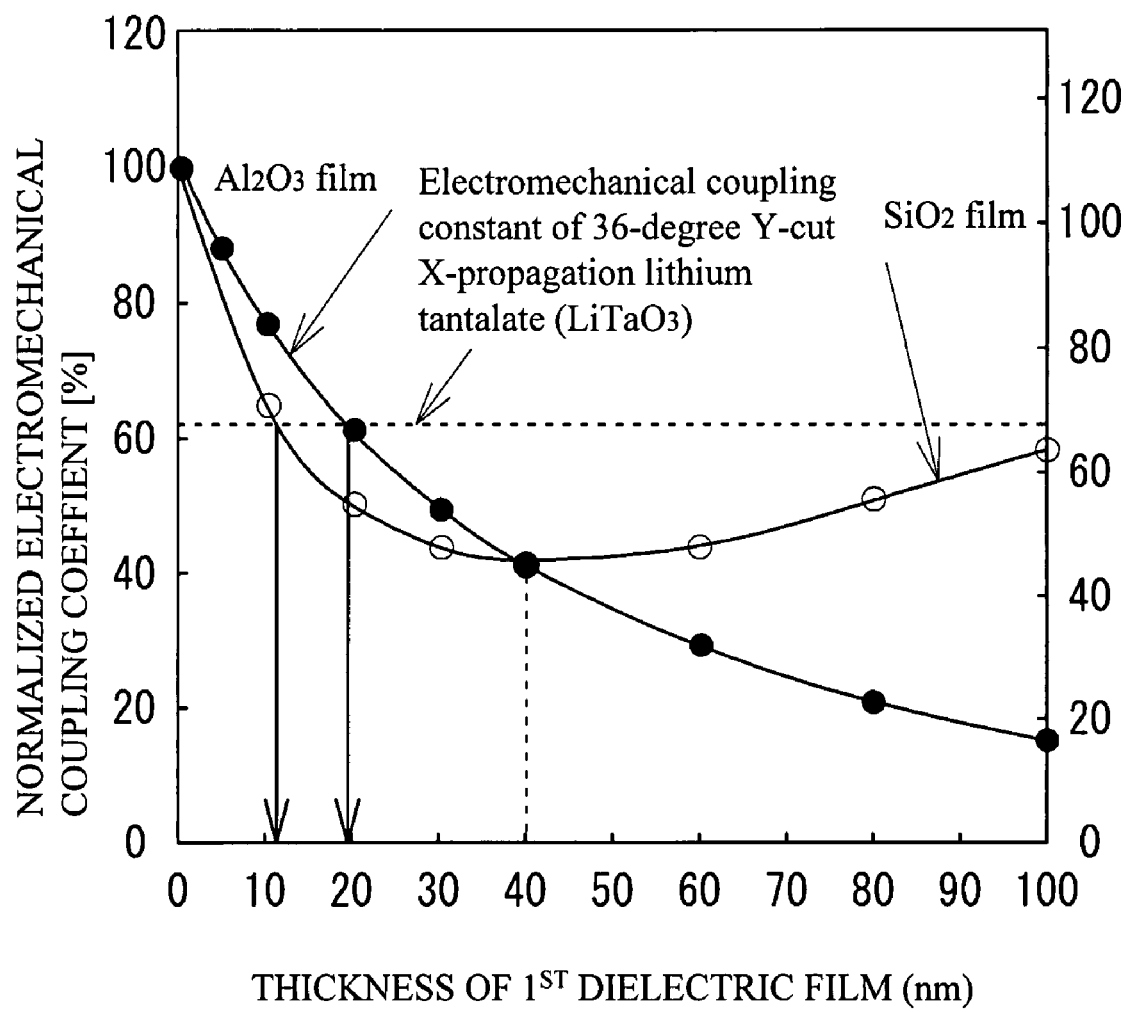
FIG. 11 shows a relationship between a film thickness and an electromechanical coupling coefficient for when an aluminum oxide film and a silicon oxide film are used in the third comparative example.

FIG. 11 is a graph of the electromechanical coupling coefficients of two different types of the first comparative example as a function of the thickness of the first dielectric film 24. The first type of the first comparative example employs the first dielectric film 24 made of silicon oxide (which has a relative dielectric constant of approximately 4.2), and the second type thereof employs the first dielectric film 24 made of aluminum oxide (which has a relative dielectric constant of approximately 9.0, which is greater than that of silicon oxide). The electromechanical coupling coefficient of FIG. 11 is obtained in the same manner as that of FIG. 7, and therefore, a description thereof will be omitted here.

Figure 12:
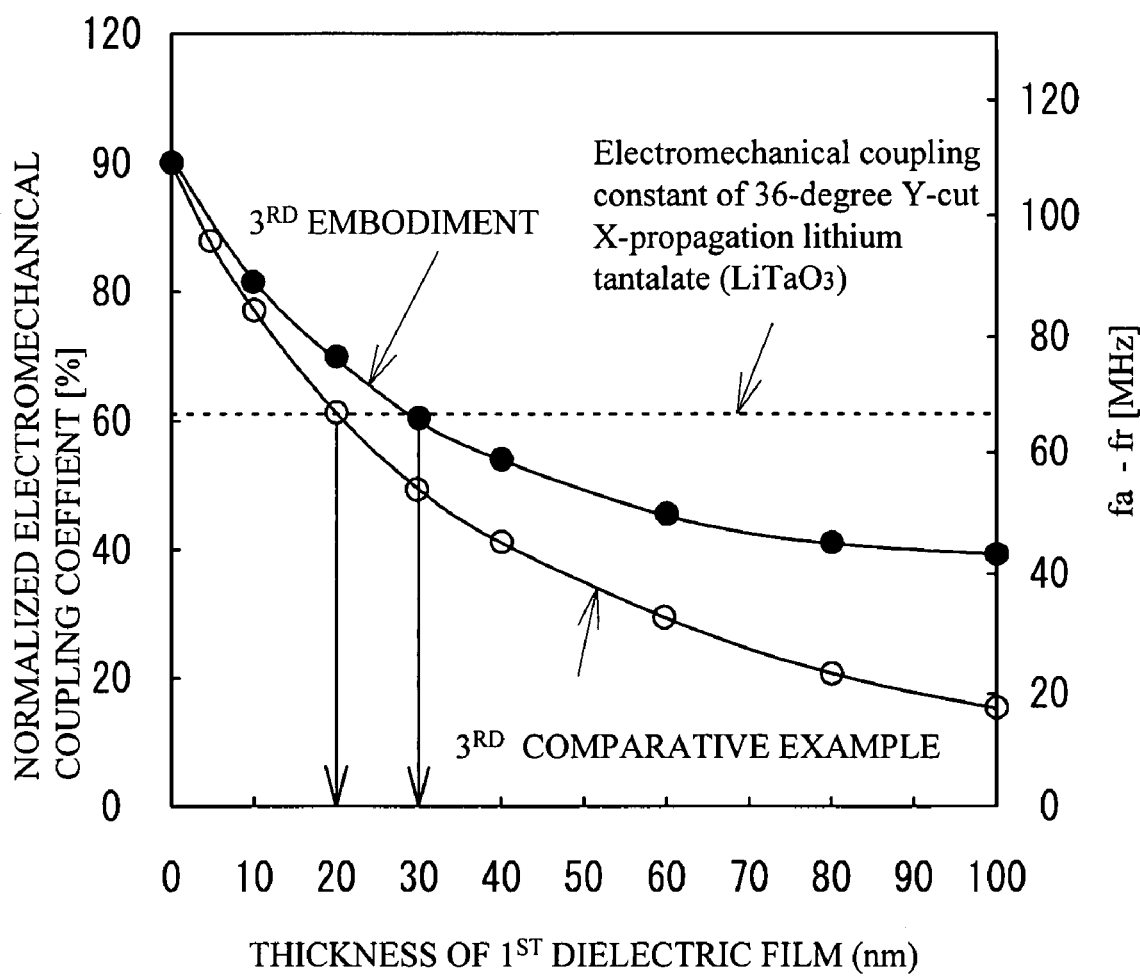
FIG. 12 shows a relationship between a film thickness and an electromechanical coupling coefficient in the third comparative example and the third embodiment.

FIG. 12 shows the electromechanical coupling coefficients of the acoustic wave devices of the third example and the third comparative example having the first dielectric film 24 made of aluminum oxide as a function of the thickness of the first dielectric film 24. The electromechanical coupling coefficient of FIG. 11 is obtained in the same manner as that of FIG. 7. That is, the vertical axis of the graph denotes the normalized electromechanical coupling coefficient.

Figure 13:
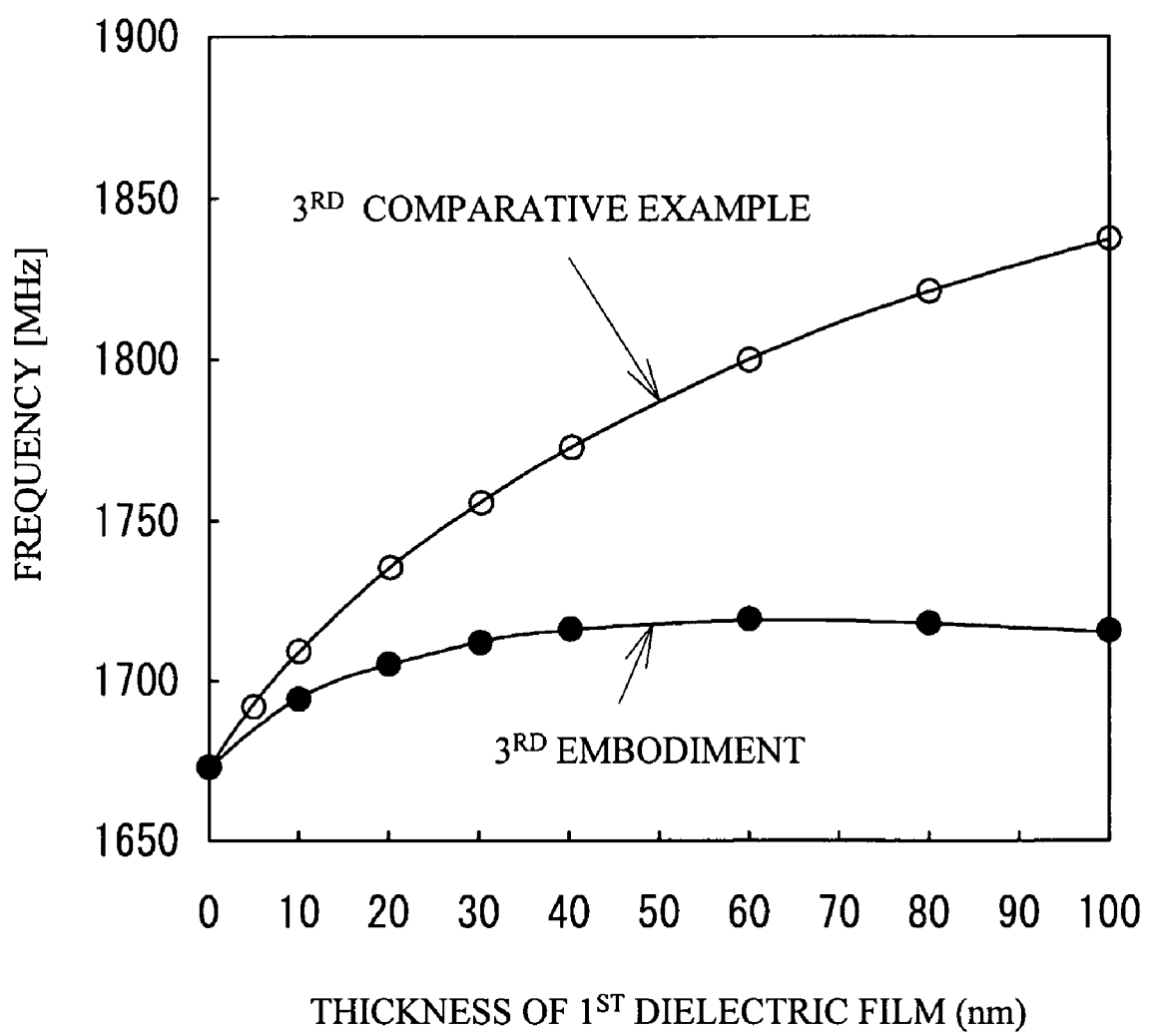
FIG. 13 shows a relationship between a film thickness and frequency in the third comparative example and the third embodiment.

FIG. 13 shows frequency changes of the third embodiment and the third comparative example with the first dielectric film 24 being made of aluminum oxide as a function of the thickness of the first dielectric film 24. The frequency is obtained by the finite element method.

It can be seen from FIG. 11 that the device with the first dielectric film 24 made of aluminum oxide has a smaller change of the electromechanical coupling coefficient with respect to change of the thickness of the first dielectric film 24 than the device with the first dielectric film 24 made of silicon oxide when the first dielectric film 24 is approximately equal to or smaller than 40 nm (0.02λ). FIG. 11 also shows that the aluminum nitride film is thicker than the silicon oxide film in order to obtain an identical electromechanical coupling coefficient. Thus, the device with the dielectric film 24 made of aluminum oxide has better controllability of the electromechanical coupling coefficient than the device with the dielectric film 24 made of silicon oxide and has an easier fabrication process in terms of thickness control.

When the silicon oxide film is approximately 40 nm (0.02λ) thick or more, the electromechanical coupling coefficient increases as the first dielectric film becomes thicker. This is because the electromechanical coupling coefficient is much more influenced by the silicon oxide film than the piezoelectric substrate. Thus, the acoustic wave is much more influenced by the silicon oxide film, more specifically, by the mechanical resonance sharpness. Generally, the resonance sharpness (Q value) of the silicon oxide film grown is worse than that of the piezoelectric substrate of a single crystal. Thus, it is not preferable that the silicon oxide film is made as thick as 40 nm (0.02λ) or more.

The general SAW filters employed in the cellular phones use an acoustic wave device having a piezoelectric substrate of 36° Y-cut X-propagation lithium tantalate. In order to obtain an electromechanical coupling coefficient as large as that of the above device, preferably, the silicon oxide film is approximately 10 nm (0.005λ) thick and the aluminum oxide film is approximately 20 nm (0.01λ) thick, as shown in FIG. 11.

As has been described, FIG. 11 relates to the third comparative example in which the first dielectric film 24 is formed on the entire surface of the piezoelectric substrate 12. Similar effects to those of FIG. 11 may be obtained by the third embodiment in which the side surfaces of the fingers of the comb electrodes 14 and the reflection electrodes 16 are flush with the side surfaces of the first dielectric film 24, and the second dielectric film 26 contacts the piezoelectric substrate 12.

It can be seen from FIG. 12 that the third embodiment has a smaller change of the electromechanical coupling coefficient with respect to change of the first dielectric film 24 than the third comparative example. Thus, the third example is capable of more precisely controlling the electromechanical coupling coefficient than the third comparative example.

Further, it can be seen from FIG. 12 that the first dielectric film 24 of the third embodiment is thicker than that of the third comparative example in order to obtain an identical electromechanical coupling coefficient. Thus, the third embodiment can be fabricated more easily than the third comparative example in view of control of film thickness.

The acoustic wave device used for the cellular phones generally employs a piezoelectric substrate made of 36°Y-cut X-propagation lithium tantalate. In order to obtain almost the same electromechanical coupling coefficient as that of the above device, FIG. 12 shows that preferably, the first dielectric film 24 of aluminum oxide is approximately 30 nm thick (0.015λ) in the third embodiment and is approximately 20 nm thick (0.01λ) in the third comparative example.

It can be seen from FIG. 13 that the third embodiment has a smaller frequency change with respect to change of the thickness of the first dielectric film 24 than the third comparative example. The reason why the frequency is changed responsive to change of the thickness of the first dielectric film 24 is that the acoustic velocity of the aluminum oxide film is greater than that of the silicon oxide film, and the velocity of the boundary wave is thus changed by changing the thickness of the aluminum oxide film that forms the first dielectric film 24. The first dielectric film 24 of the third embodiment is removed between the adjacent electrode fingers. Thus, the third embodiment has a smaller width of the first dielectric film 24 in the propagation direction of boundary wave than that of the first dielectric film 24 of the third comparative example which is provided on the entire surface of the piezoelectric substrate 12. Thus, the first dielectric film 24 of the third embodiment is less affected than that of the third comparative example. Thus, the third embodiment has less frequency change with respect to change of the thickness of the first dielectric film 24 than the third comparative example. Thus, the third embodiment is capable of more precisely controlling the frequency than the third comparative example.

FIG. 13 originally relates to the acoustic devices of the third embodiment and the third comparative example. Similar advantages may be obtained in the first embodiment and the first comparative example.

The width of the first dielectric film 24 of the first embodiment in the direction of SAW propagation is smaller than that of the first dielectric film 24 of the second embodiment. Thus, the first embodiment has a smaller change of frequency with respect to change of the thickness of the first dielectric film 24 than the second embodiment. This shows that the first embodiment has more precise frequency controllability than the second embodiment. This holds true for the acoustic wave devices such as Love wave devices and boundary wave devices. Preferably, these acoustic wave devices have a small width of the first dielectric film 24 in the direction in which the acoustic wave is propagated, as in the case of the third embodiment.

The second dielectric film 26 of the third embodiment is preferably made of silicon oxide in view of improvements in the temperature characteristic of frequency. Preferably, the thickness of the second dielectric film 26 measured from the first dielectric film 24 is greater than that of the comb electrodes 14 and the reflection electrodes 16. Particularly, since the energy of boundary wave is confined in the surface of the piezoelectric substrate 12 and the second dielectric film 26, it is preferable to set the thickness of the second dielectric film 26 approximately equal to 0.1λ to 1.0λ where λ is the period of the comb electrodes 14.

The first dielectric film 24 of the third embodiment is preferably made of aluminum oxide. However, another material may be used. Another material for the first dielectric film 24 may have a relative dielectric constant greater than that of the material for the second dielectric film 26. With this structure, the electromechanical coupling coefficient can be controlled more precisely, and the film thickness can be controlled more easily. For example, silicon nitride may be used to form the first dielectric film 24.

The third dielectric film 28 of the third embodiment is not limited to aluminum oxide but may be made of another material capable of confining the energy of the boundary wave in the surface of the piezoelectric substrate 12 and the second dielectric film 26. The acoustic velocity of the third dielectric film 28 made of such a material is greater than that of the second dielectric film 26. For example, the third dielectric film 28 may be made of silicon or silicon nitride.

The above-mentioned third embodiment is an exemplary acoustic wave device in which the boundary wave is propagated. Another type of acoustic wave device such as a Love wave device has good controllability of the electromechanical coupling coefficient and the film thickness as in the case of the third embodiment. The acoustic wave device in which the Love wave is propagated differs from the acoustic wave device with the boundary wave in that the former acoustic wave device does not have the third dielectric film 28. The Love wave device is preferably provided with the second dielectric film 26 made of silicon oxide in order to improve the temperature characteristic of frequency. The thickness of the second dielectric film 26 measured from the first dielectric film 24 is preferably made greater than that of the comb electrodes 14 and the reflection electrodes 16 measured from the first dielectric film 24. More preferably, the second dielectric film 26 is 0.1λ to 0.3λ thick in view of improvements in the temperature characteristic of frequency.

In the first through third embodiments, the first dielectric film 24 is totally removed from the sections between the adjacent electrode fingers of the comb electrodes 14 and the reflection electrodes 16 in the direction of the aperture length, which is perpendicular to the direction in which the acoustic wave is propagated. In other words, the dielectric film 24 does not have any portion that connects the adjacent electrode fingers over the aperture length. However, the first through third embodiments are not limited to this structure but may be configured that the first dielectric film 24 has a portion that partially connects the adjacent electrode fingers. The acoustic wave device with the above portion of the first dielectric film 24 has a smaller change of the electromechanical coupling coefficient with respect to change of the thickness of the dielectric film 24 than the first or third comparative example in which the first dielectric film 24 is provided on the entire surface of the piezoelectric substrate 12.

The first dielectric film 24 of the aforementioned first through third embodiments is made of aluminum oxide. The aluminum oxide film has high resistance to dry etching. Thus, when dry etching is used to form the first dielectric film 24, undercut may be reduced and deviation in performance can be restrained.

The piezoelectric substrate 12 employed in the first through third embodiments is not limited to lithium niobate but may be made of another material, which preferably has a large electromechanical coupling coefficient such as lithium tantalate. The electromechanical coupling coefficient is adjusted so as to be smaller by thickening the first dielectric film 24. Therefore, a wide adjustable range is available for a material having a large electromechanical coupling coefficient.

Fourth Embodiment

Figure 14:
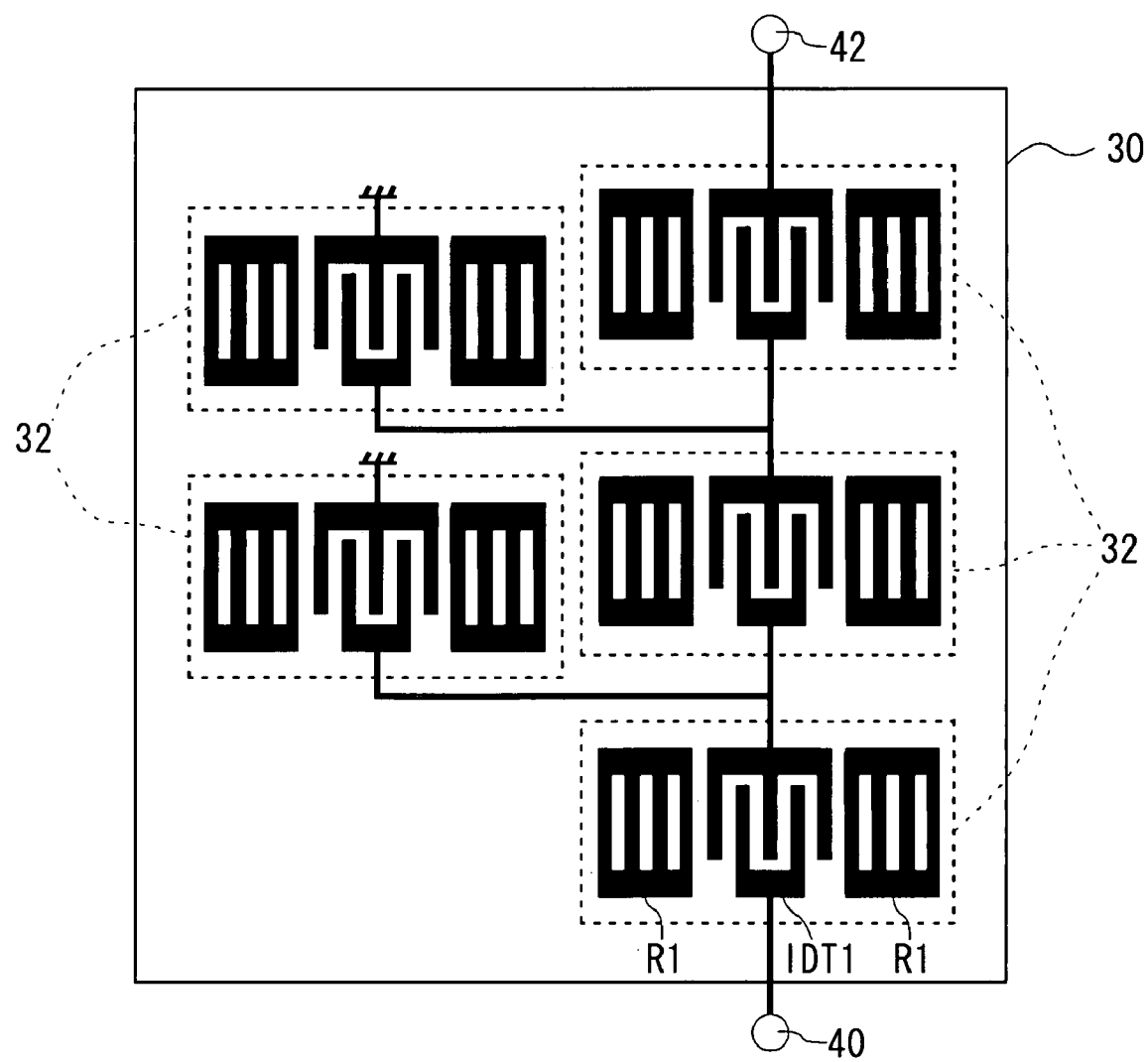
FIG. 14 schematically shows a filter in accordance with a fourth embodiment.

FIG. 14 schematically illustrates a filter in accordance with a fourth embodiment. Referring to this figure, a ladder type filter 30 has three one-port resonators 32 connected in series and arranged in series arms, and two one-port resonators 32 arranged in parallel arms. Each of the one-port resonators 32 has a pair of reflection electrodes and a pair IDT1 of comb electrodes interposed between the pair of reflection electrodes. Each one-port resonator 32 may be the acoustic wave devices configured in any of the first through third embodiments. One end of the ladder filter 30 is connected to a first terminal 40, and the other end is connected to a second terminal 42. The first and second terminals 40 and 42 may function as input and output terminals, respectively.

Fifth Embodiment

Figure 15:
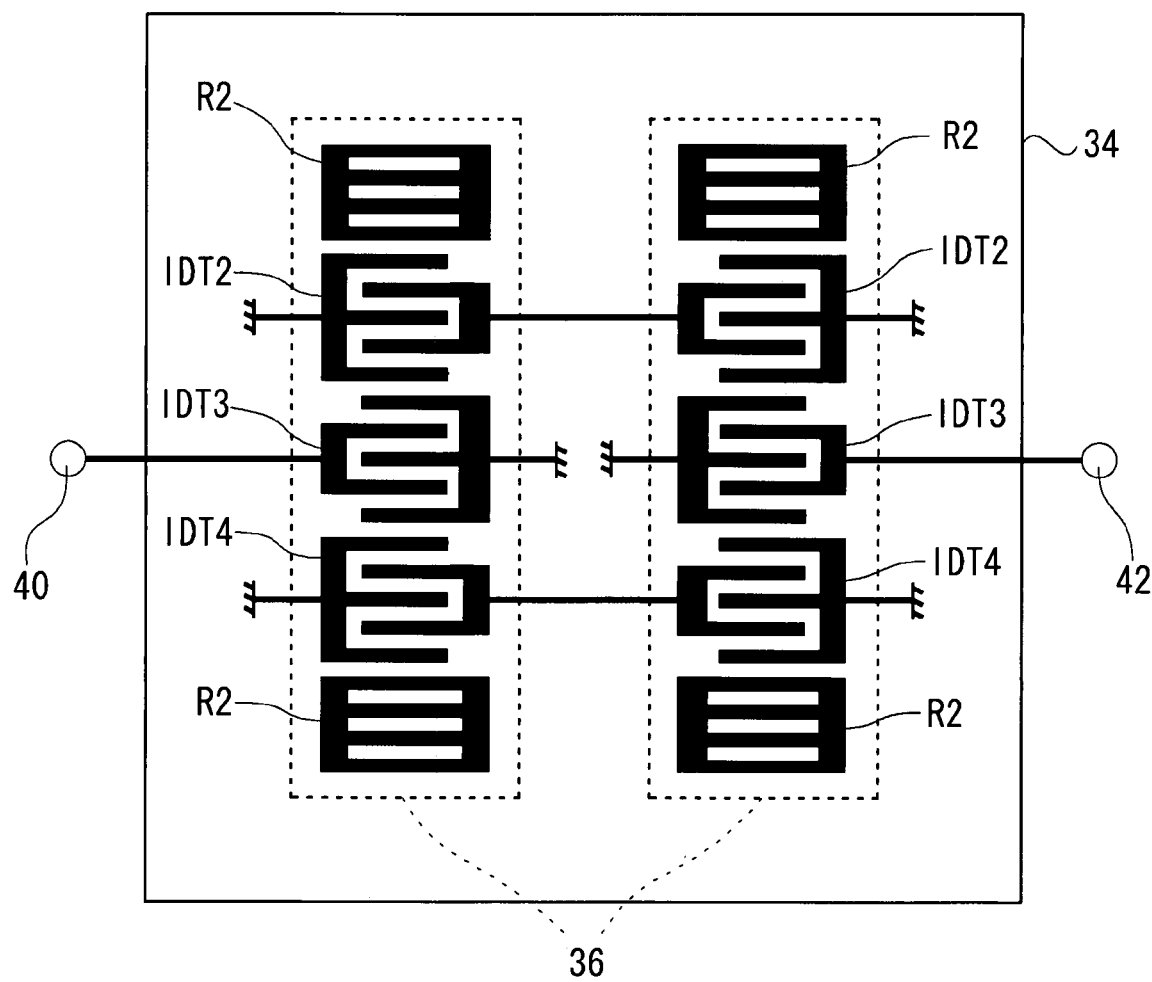
FIG. 15 schematically shows a filter in accordance with a fifth embodiment.

FIG. 15 schematically shows a filter in accordance with a fifth embodiment. Referring to this figure, a filter 34 includes two double-mode filters 36, each of which includes three interdigital transducers IDT1, IDT2 and IDT3, and a pair of reflection electrodes between which the three interdigital transducers are interposed and aligned. The first terminal 40 is connected to one of the two double-mode filters 36 and the second terminal 42 is connected to the other. The double-mode filters 36 may be the acoustic wave devices configured in any of the first through third embodiments. The two double-mode filters 36 are connected in series in which the two resonators IDT2 are connected together and the two resonators IDT4 are connected together.

Sixth Embodiment

Figure 16:
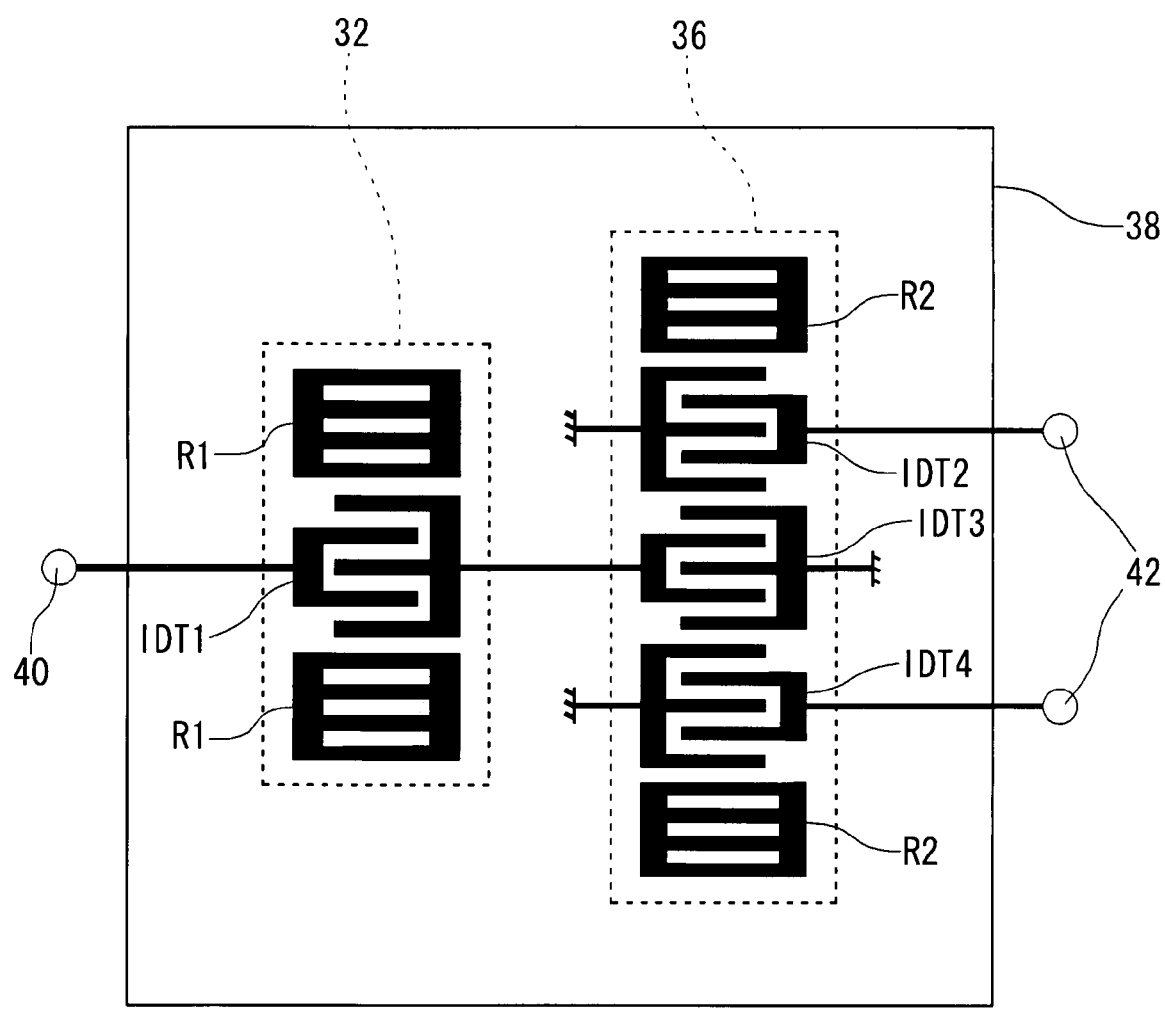
FIG. 16 schematically shows a filter in accordance with a sixth embodiment.

FIG. 16 schematically shows a filter in accordance with a sixth embodiment. Referring to this figure, a filter 38 has a combination of the one-port resonator 32 and the double-mode filter 36. The one-port resonator 32 may be the fourth embodiment shown in FIG. 14, and the double-mode filter 36 may be the fifth embodiment shown in FIG. 15. The first terminal 40, which may be an input terminal, is connected to IDT1 of the one-port resonator 32, and two second terminals 42, which may be output terminals, are connected to IDT2 and IDT4. The IDT1 is connected to IDT3, so that the one-port resonator 32 and the double-mode filter 36 are connected in series.

The different types of filters in accordance with the fourth through sixth embodiments have improved controllability of the electromechanical coupling coefficients and have a narrow pass band with a sharp rising edge.

The present invention includes other types of filters that may be obtained by arbitrary combinations of the fourth through sixth embodiments, and duplexers formed by combined resonators and filters. These filters and duplexers will have advantages similar to the above-mentioned advantages.

The present invention is not limited to the specifically disclosed embodiments but other embodiments and variations may be made without departing from the scope of the present invention.

The present application is based on Japanese Patent Application No. 2006-252631 filed on Sep. 19, 2006, the entire disclosure of which is hereby incorporated by reference.

What is claimed is:

1. An acoustic wave device comprising:
a piezoelectric substrate;
a first dielectric film formed on the piezoelectric substrate; and
electrodes that are provided on the first dielectric film and excite an acoustic wave, the electrodes including electrode fingers,
the first dielectric film being cut out between adjacent electrode fingers among the entire electrode fingers,
wherein the first dielectric film comprises an aluminum oxide film, and
wherein a thickness of the first dielectric film is less than $0.02\ \lambda$, $\lambda$ is a period of the electrode fingers, and the second dielectric film comprises a silicon oxide film.

2. The acoustic wave device as claimed in claim 1, wherein side surfaces of the first dielectric film are flush with those of the electrode fingers.

3. The acoustic wave device as claimed in claim 1, further comprising a second dielectric film that covers the electrodes, wherein the first dielectric film has a relative dielectric constant greater than that of the second dielectric film.

4. The acoustic wave device as claimed in claim 3, wherein the second dielectric film has a thickness measured from an upper surface of the first dielectric film, said thickness being greater than that of the electrodes measured from the upper surface of the first dielectric film.

5. The acoustic wave device as claimed in claim 1, further comprising a third dielectric film provided on the second dielectric film, wherein the third dielectric film has an acoustic velocity greater than that of the second dielectric film.

6. The acoustic wave device as claimed in claim 5, wherein the third dielectric film comprises an aluminum oxide film.

7. The acoustic wave device as claimed in claim 1, wherein the piezoelectric substrate comprises one of lithium tantalate and lithium niobate.

8. A filter comprising multiple resonators that include an acoustic wave device comprising:
a piezoelectric substrate;
a first dielectric film formed on the piezoelectric substrate; and
electrodes that are provided on the first dielectric film and excite an acoustic wave, the electrodes including electrode fingers,
the first dielectric film is cut out between adjacent electrode fingers among the entire electrode fingers,
wherein the first dielectric film comprises an aluminum oxide film, and
wherein a thickness of the first dielectric film is less than $0.02\ \lambda$, $\lambda$ is a period of the electrode fingers, and the second dielectric film comprises a silicon oxide film.

* * * * *